(12) United States Patent
Goel et al.

(10) Patent No.: US 9,774,324 B2
(45) Date of Patent: Sep. 26, 2017

(54) BIASING SCHEME FOR HIGH VOLTAGE CIRCUITS USING LOW VOLTAGE DEVICES

(71) Applicant: Intel Corporation, Santa Clara, CA (US)

(72) Inventors: Mayank Goel, Bangalore (IN); Prasad Bhilawadi, Rabkav (IN); Karthik Ns, Bangalore (IN)

(73) Assignee: Intel Corporation, Santa Clara, CA (US)

(*) Notice: Subject to any disclaimer, the term of this patent is extended or adjusted under 35 U.S.C. 154(b) by 103 days.

(21) Appl. No.: 14/561,477

(22) Filed: Dec. 5, 2014

(65) Prior Publication Data

US 2016/0164515 A1   Jun. 9, 2016

(51) Int. Cl.
*H03K 17/687* (2006.01)
*H03K 17/16* (2006.01)

(52) U.S. Cl.
CPC ......... *H03K 17/687* (2013.01); *H03K 17/165* (2013.01); *H03K 2217/0027* (2013.01)

(58) Field of Classification Search
USPC ......................................................... 327/434
See application file for complete search history.

(56) References Cited

U.S. PATENT DOCUMENTS

| | | | | |
|---|---|---|---|---|
| 5,642,071 A | * | 6/1997 | Sevenhans | H03D 7/1433 327/103 |
| 5,818,292 A | * | 10/1998 | Slemmer | G11C 5/143 323/313 |
| 5,986,472 A | * | 11/1999 | Hinedi | H03K 19/00315 326/68 |
| 6,040,729 A | * | 3/2000 | Sanchez | H03K 19/00315 326/68 |
| 6,518,818 B1 | * | 2/2003 | Hynes | H03K 19/00315 326/81 |
| 2007/0063687 A1 | | 3/2007 | Zhou et al. | |
| 2014/0022823 A1 | | 1/2014 | Chen et al. | |
| 2014/0247087 A1 | | 9/2014 | Bhattad et al. | |
| 2014/0320179 A1 | | 10/2014 | Lin et al. | |
| 2015/0381120 A1 | * | 12/2015 | Fan | H03F 1/0205 330/296 |

FOREIGN PATENT DOCUMENTS

EP         0905902 A2    3/1999

OTHER PUBLICATIONS

"International Application Serial No. PCT/US2015/059892, International Search Report mailed Feb. 24, 2016", 3 pgs.
"International Application Serial No. PCT/US2015/059892, Written Opinion mailed Feb. 24, 2016", 7 pgs.

* cited by examiner

*Primary Examiner* — Lincoln Donovan
*Assistant Examiner* — Patrick Chen
(74) *Attorney, Agent, or Firm* — Schwegman Lundberg & Woessner, P.A.

(57) ABSTRACT

Some embodiments include apparatus and methods having a first node to receive a supply voltage, a second node to receive a first bias voltage, a third node to receive ground potential, a first circuit branch coupled between the first and second nodes, and a second circuit branch coupled between the first and third nodes. The first bias voltage is provided to a gate of a first transistor among a plurality of transistors coupled in series. The first and second circuit branches are arranged to provide a second bias voltage to gate of a second transistor among the plurality of transistors. The value of the second bias voltage is based on a value of the first bias voltage.

13 Claims, 6 Drawing Sheets

BIASING SCHEME FOR HIGH VOLTAGE CIRCUITS USING LOW VOLTAGE DEVICES

TECHNICAL FIELD

Embodiments described herein pertain to input/output circuitry in electronic items. Some embodiments relate to circuits operating at different voltages.

BACKGROUND

I/O circuits (e.g., I/O buffers) are included components (e.g., transceivers) of many electronic devices or systems, such as computers, tablets, cellular phones, and memory cards. Many conventional I/O circuits operate at a relatively high voltage using low voltage devices (e.g., transistors), for example a 3.3V IO using 1.8V devices. In such conventional I/O circuits, a reference voltage is often used in order to protect the low voltage devices from voltage stress that may cause lifetime degradation. Although the device reliability issues are addressed, such conventional I/O circuits may suffer from one or more other issues, as described in detail below.

DETAILED DESCRIPTION

Figure 1:
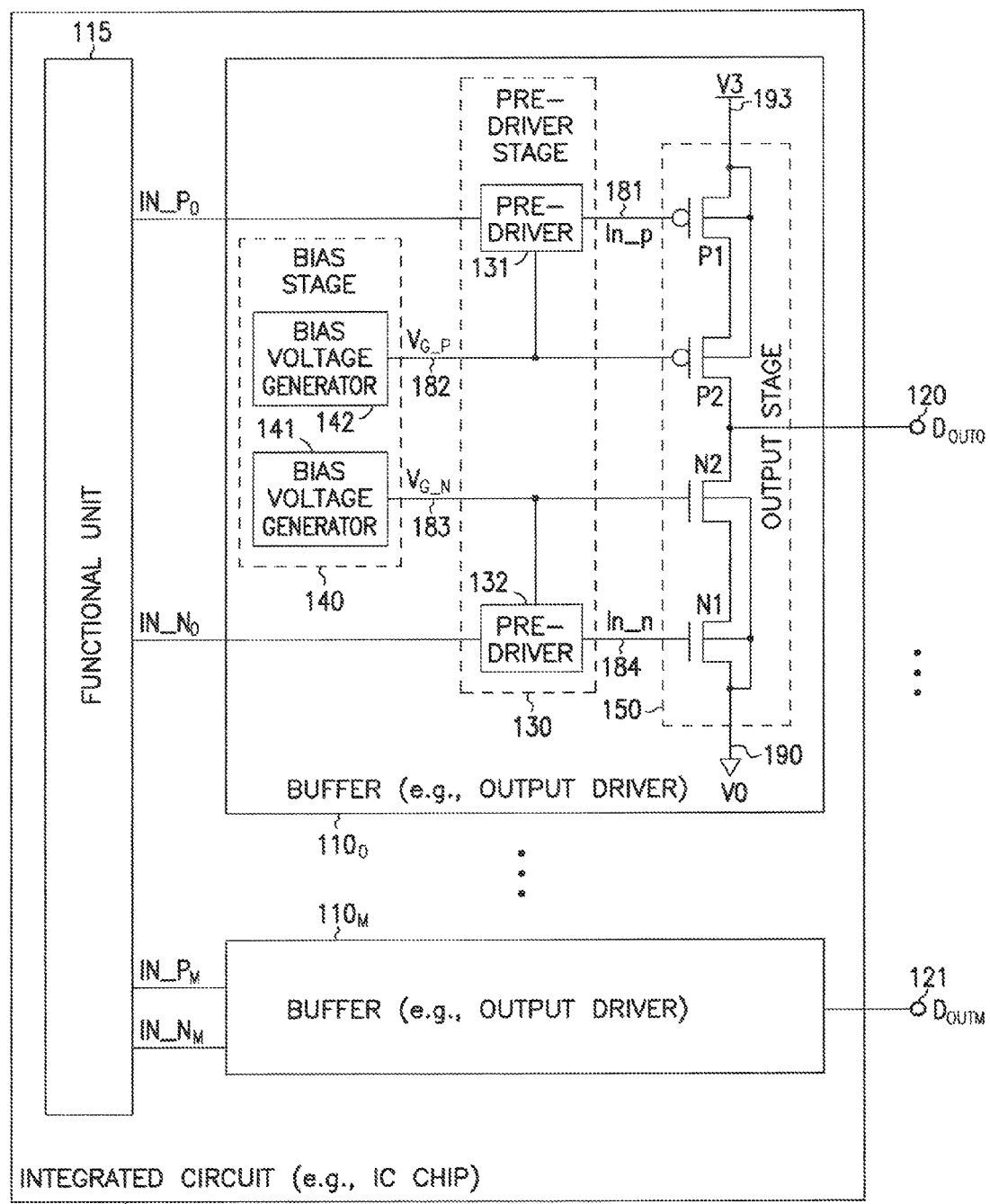
FIG. 1 shows an apparatus including an integrated circuit (IC) having buffers, according to some embodiments described herein.

FIG. 1 shows an apparatus 100 including an integrated circuit (IC) 101 having buffers (e.g., output driver circuits) $110_0$ through $110_M$ to provide information (e.g., in the form of signals) from a functional unit 115 to nodes 120 and 121, according to some embodiments described herein. Apparatus 100 can include or be included in an electronic device or system, such as a computer (e.g., desktop, laptop, or notebook), a tablet, a cellular phone, a memory card (e.g., a Secure Digital (SD) memory card, a MultiMediaCard (MMC), a flash memory card, a Subscriber Identity Module (SIM) card, and other types of memory cards), or other electronic devices or systems. IC 101 can include a processor, a memory device, a system on chip (SoC), or other electronic devices or systems. IC 101 can include an IC die (e.g., an IC chip, such as a semiconductor chip).

Functional unit 115 of IC 101 can include components (e.g., circuits and logic) of a processor (e.g., to process information, such as data), a memory device (e.g., to store information), or both. Nodes 120 and 121 can include corresponding output nodes of buffer $110_0$ through $110_M$ and can form part of input/output (I/O) connections (e.g., I/O pads) of IC 101 to allow buffers $110_0$ through $110_M$ to provide information from IC 101 (e.g., information originated from functional unit 115) to another device or system coupled to nodes 120 and 121. Signals (e.g., output signals) $D_{OUT0}$ and $D_{OUTM}$ on corresponding nodes 120 and 121 can represent information (e.g., data) to be provided by IC 101 to another device (or system). FIG. 1 shows IC 101 including two buffers $110_0$ through $110_M$ and two associated nodes 120 and 121, as an example. The number of buffers of IC 101 may vary.

In FIG. 1, the value of signals $D_{OUT0}$ can be based on the values of signals (e.g., input signals) $IN\_P_0$ and $IN\_N_0$. The value of signal $D_{OUTM}$ can be based on the values of signals (e.g., input signals) $IN\_P_M$ and $IN\_N_M$. Signals $IN\_P_0$ and $IN\_N_0$ may be in-phase signals. Signals $IN\_P_M$ and $IN\_N_M$ may be in-phase signals. Signals $IN\_P_0$, $IN\_N_0$, $IN\_P_0$, and $IN\_N_0$ can carry information (e.g., data) processed by functional unit 115 or information stored in memory cells (not shown) of IC 101.

For simplicity, FIG. 1 shows details of only one of buffers $110_0$ through $110_M$. Buffers $110_0$ through $110_M$ may include similar or identical circuit components. As shown in FIG. 1, buffers $110_0$ can include a pre-driver stage 130 that includes pre-drivers 131 and 132, a bias stage 140 that includes bias voltage generators 141 and 142, and an output stage 150 that includes transistors P1, P2, N1, and N2 that can be coupled in series (e.g., arranged as a stack) between nodes 190 and 193. Each of transistors P1 and P2 can include p-channel field effect transistors, such as a p-channel metal-oxide semiconductor (PMOS) transistor. Each of transistors N1 and N2 can include an n-channel field effect transistor, such as an n-channel metal-oxide semiconductor (NMOS) transistor.

Pre-driver stage 130 and bias stage 140 can operate to control the values of signals (e.g., input signals) In_p and In_n (at corresponding nodes 181 and 184) and the values of voltages (e.g., bias voltages) $V_{G\_P}$ and $V_{G\_N}$ (at corresponding nodes 182 and 183) to control (e.g., turn on or off) transistors P1, P2, N1, and N2 in order to switch the signal between different levels (e.g., voltage levels). For example, pre-driver stage 130 and bias stage 140 can turn on transistors P1, P2, and N2 while they turn off transistor N1 in order to switch signal $D_{OUT0}$ from a level corresponding to the value of voltage V0 at node 190 to another level corresponding to the value of voltage a V3 at node 193. In another example, pre-driver stage 130 and bias stage 140 can turn on transistors N1, N2, and P2 while they turn off transistor P1 in order to switch signal $D_{OUT0}$ from the level corresponding to the value of voltage V3 to the level corresponding to the value of voltage V0.

Voltage V0 can have a value of zero volts (e.g., ground potential). Voltage V3 can have a positive value. Voltage V0 can include a supply voltage (e.g., rail supply voltage Vss) of IC 101. Voltage V3 can include another supply voltage (e.g., rail supply voltage VDD_IO). Since voltages V0 and V3 can include rail supply voltages of IC 101, signal $D_{OUT}$ can switch from rail to rail (e.g., can have a full swing). In some arrangements, voltage V3 can have a value of approximately 3.3V. Thus, in some arrangements, signal $D_{OUT}$ can switch between 0V and 3.3V.

Pre-driver 131 can receive a signal (e.g., input signal) IN_P and generate signal In_p based on signal IN_P. Signal In_p can switch (e.g., can have a signal swing) between levels (e.g., voltage levels) based on the values of voltages $V_{G\_P}$ and V3. The value of voltage $V_{G\_P}$ may be greater than zero. Thus, signal In_p may not have a full swing (may not swing from zero to V3). In some arrangements, the value of voltage $V_{G\_N}$ may be zero. For example, the value of voltage $V_{G\_N}$ may be zero when the value of voltage V3 is within the operating limit of transistors P1, P2, N1, and N2.

Pre-driver 132 can receive a signal (e.g., input signal) IN_N and generate signal In_n based on signal IN_N. Signal In_n can switch (e.g., can have a signal swing) between levels (e.g., voltage levels) based on the values of voltages V0 and $V_{G\_N}$. The value of voltage $V_{G\_N}$ is greater than zero. Thus, signal In_n may not have a full swing (may not swing from zero to V3).

Bias voltage generator 141 can generate voltage $V_{G\_N}$. The value of voltage $V_{G\_N}$ can be relatively constant at (e.g., remain at 1.8V) during the operation of buffer 110$_0$. Bias voltage generator 141 of buffer 110$_0$ may be shared by the buffers (e.g., buffers 110$_0$ through 110$_M$) of IC 101. For example, node 183 in buffer 110$_0$ may also be coupled to buffers 110$_M$, so that voltage $V_{G\_N}$ at node 183 may also be provided as a bias voltage to buffer 110$_M$.

Bias voltage generator 142 can generate voltage $V_{G\_P}$. The value of voltage $V_{G\_P}$ can be based on a value of voltage $V_{G\_N}$. For example, the value of voltage $V_{G\_P}$ can be the difference between the values of voltages V3 and $V_{G\_N}$. The value of voltage $V_{G\_P}$ can be relatively constant at (e.g., remain at $V_{G\_P}$=V3−$V_{G\_N}$) during the operation of buffer 110$_0$. Bias voltage generator 142 of buffer 110$_0$ may be shared by the buffers (e.g., buffers 110$_0$ through 110$_M$) of IC 101. For example, node 182 in buffer 110$_0$ may also be coupled to buffers 110$_M$, so that voltage $V_{G\_P}$ at node 182 may also be provided as a bias voltage to buffer 110$_M$.

Transistors P1, P2, N1, and N2 can have an operating voltage tolerance less than the value of voltage V3. For example, each of transistors P1, P2, N1, and N2 can be relatively low voltage device relative to voltage V3. For example, each of transistors P1, P2, N1, and N2 may be a 1.8V transistor (1.8V device), such that the transistor may have an operating gate-to-drain voltage ($V_{GD}$=1.8V) less than V3 (e.g., 3.3V, an operating gate-to-source voltage (e.g., $V_{GS}$=1.8V) less than V3), and an operating drain-to-source voltage (e.g., $V_{DS}$=1.8V) less than voltage V3. Although transistors P1, P2, N1, and N2 may be low voltage devices (e.g., 1.8V devices), the arrangement of transistors P1, P2, N1, and N2 with pre-driver stage 130 and bias stage 140 as described above, may allow buffers 110$_0$ through 110$_M$ to operate safely (e.g., operate in an electrical over-stress safe condition) at a higher operating voltage (e.g., V3 of 3.3V).

Each of buffers 110$_0$ through 110$_M$ can include a buffer described below with reference to FIG. 2 through FIG. 8.

Figure 2:
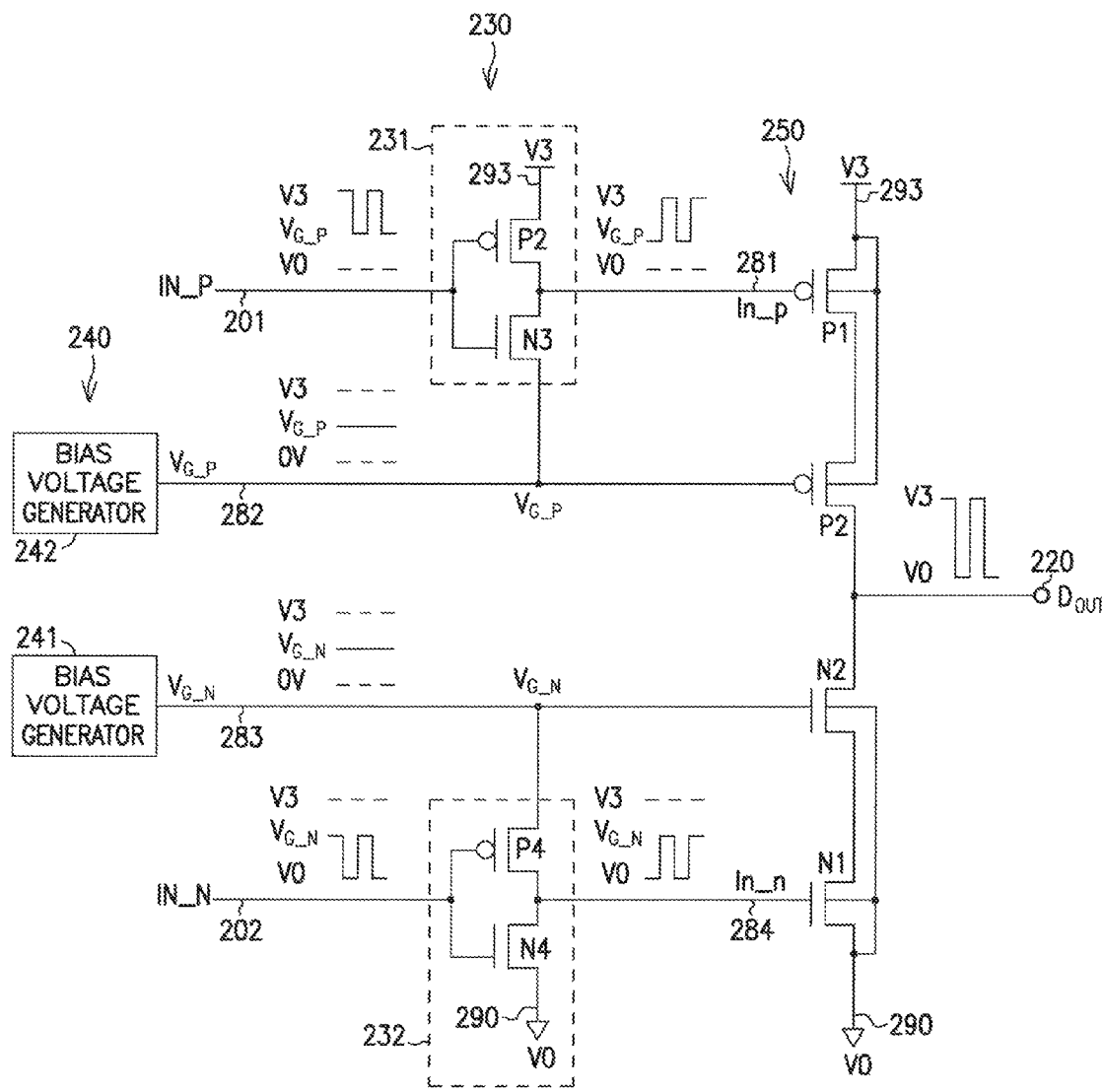
FIG. 2 shows a circuit diagram of a buffer, according to some embodiments described herein.

FIG. 2 shows a circuit diagram of a buffer 210, according to some embodiments described herein. Buffer 210 can be used as each of buffers 110$_0$ through 110$_M$ (FIG. 1). Buffer 210 can include nodes (e.g., input nodes) 201 and 202 to receive signals (input signals) IN_P and IN_N, respectively, and a node (e.g., output node) 220 to provide a signal (e.g., output signal) D$_{OUT}$. Signals IN_P, IN_N, and D$_{OUT}$ can correspond to signals IN_P$_0$, IN_N$_0$, and D$_{OUT0}$, respectively, of buffer 110$_0$ (FIG. 1) or correspond to signals IN_P$_M$, IN_N$_M$, and D$_{OUTM}$, respectively, of buffer 110$_M$ (FIG. 1).

Buffer 210 can include a pre-driver stage 230 having pre-drivers 231 and 232, a bias stage 240 having bias voltage generators 241 and 242, and an output stage 250 having a pair of transistors P1 and P2 and a pair of transistors N1 and N2. Transistors P1, P2, N1, and N2 can correspond to transistors P1, P2, N1, and N2 of FIG. 1.

As shown in FIG. 2, transistor P1 and P2 can be coupled (e.g., coupled in series) between a node (e.g., supply node) 293 and node 220. Transistor N1 and N2 can be coupled (e.g., coupled in series) between node 220 and node (e.g., supply node) 290. Nodes 290 and 293 can receive voltage V0 and V3, respectively. Voltage V0 can have a value of zero volts (e.g., ground potential). Voltages V0 and V3 can include supply rail voltages of an IC (e.g., IC 101) that includes buffer 210. Signal D$_{OUT}$ at node 220 can switch (e.g., can have a signal swing) between levels (e.g., voltage levels) based on the values of voltages V0 and V3. Since voltages V0 and V3 can include supply rail voltages, signal D$_{OUT}$ can switch from rail to rail (e.g., can have a full swing).

Transistor P1 includes a gate coupled to a node 281 to receive a signal (e.g., input signal) In_p. Transistor N1 includes a gate coupled to a node 284 to receive a signal In_n. Transistor P2 includes a gate coupled to a node 282 to receive a voltage (e.g., bias voltage) $V_{G\_P}$. Transistor N2 includes a gate coupled to a node 283 to receive a voltage (e.g., bias voltage) $V_{G\_N}$.

Pre-driver 231 can include a transistor (e.g., p-channel transistor) P3 and a transistor (e.g., n-channel transistor) N3 coupled between node 293 (that receive voltage V3) and a node 282 (that receive a voltage $V_{G\_P}$). Transistors P3 and N3 can operate as an inverter that has an input coupled to node 201 to receive signal IN_P and an output coupled to node 281 to provide signal In_p. Signal In_p can be an inverted version of signal IN_P. As shown in FIG. 2, signal IN_P can switch (e.g., can have a signal swing) between levels (e.g., voltage levels) based on the values of voltages $V_{G\_P}$ and V3. Signal In_p can also switch (e.g., can have a signal swing) between levels based on the values of voltages $V_{G\_P}$ and V3.

Pre-driver 232 can include a transistor (e.g., p-channel transistor) P4 and a transistor (e.g., n-channel transistor) N4 coupled between node 283 (that receives voltage $V_{G\_N}$) and a node 290 (that receives voltage V0). Transistors P4 and N4 can operate as an inverter that has an input coupled to node 202 to receive signal IN_N and an output coupled to node 284 to provide signal In_n. Signal In_n can be an inverted version of signal IN_N. As shown in FIG. 2, signal IN_N can switch (e.g., can have a signal swing) between levels (e.g., voltage levels) based on the values of voltages V0 and $V_{G\_N}$. Signal In_n can also switch (e.g., can have a signal swing) between levels based on the values of voltages V0 and $V_{G\_N}$.

Bias voltage generator 241 can generate voltage $V_{G\_N}$. The value of voltage $V_{G\_N}$ can be selected to be the maximum allowed gate-to-source voltage (e.g., $V_{GSMAX}$) of transistor N2. Voltage $V_{G\_N}$ can be generated from a supply voltage (e.g., different from voltage V3) of buffer 210, such that value of voltage $V_{G\_N}$ can include the value of the supply voltage (e.g., 1.8V) of buffer 210. Alternatively, the value of voltage $V_{G\_N}$ can be generated from a bandgap reference voltage. As shown in FIG. 2, the value of voltage $V_{G\_N}$ is greater than zero volts and can be relatively constant at (e.g., remain at 1.8V) during the operation of buffer 210.

Bias voltage generator 242 can generate a voltage (e.g., bias voltage) $V_{G\_P}$. The value of voltage $V_{G\_P}$ is based on a value of voltage $V_{G\_N}$. The value of voltage $V_{G\_P}$ can be based on the value of voltage $V_{G\_N}$ or both voltages V3 and $V_{G\_N}$. For example, the value of voltage $V_{G\_P}$ can be the difference between the values of voltages V3 and $V_{G\_N}$ (e.g., $V_{G\_P}$=V3−$V_{G\_N}$). As shown in FIG. 2, the value of voltage $V_{G\_P}$ may be greater than zero volts and may be relatively constant at (e.g., remain at $V_{G\_P}=V3-V_{G\_N}$) during the operation of buffer 210. In some arrangements, such as when value of voltage V3 is within the operating limit of transistors P1, P2, N1, and N2, the value of voltage $V_{G\_N}$ may be zero.

Figure 3A:
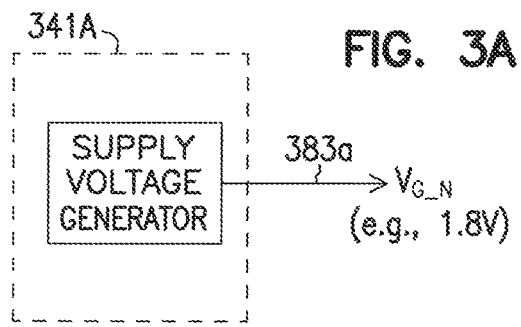
FIG. 3A and FIG. 3B show block diagrams of different bias voltage generators to generate a bias voltage, according to some embodiments described herein.
Figure 3B:
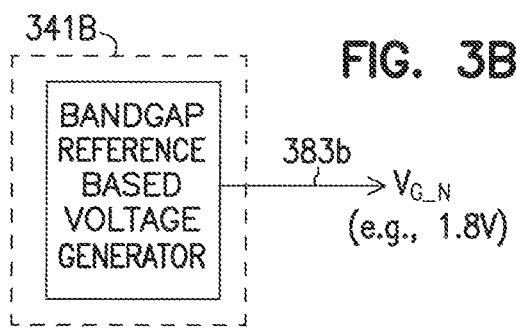

FIG. 3A and FIG. 3B show block diagrams of different bias voltage generators 341A and 341B to generate a voltage (e.g., bias voltage) $V_{G\_N}$ (at node 383a or 383b), according to some embodiments described herein. Either bias voltage generator 341A or 341B can be used as bias voltage generator 141 (FIG. 1) or bias voltage generator 241 of buffer 210 (FIG. 2). Each of node 383a and 383b can correspond to node 183 (coupled to the gate of transistor N2) of FIG. 1 or node 283 (coupled to the gate of transistor N2) of FIG. 2.

As shown in FIG. 3A, bias voltage generator 341A can include a supply voltage generator that provides a supply voltage (e.g., an IC chip supply voltage of 1.8V). As shown in FIG. 3B, bias voltage generator 341B can include a bandgap reference based voltage generator, such that voltage $V_{G\_N}$ can be generated based on a bandgap reference voltage that is generated by the bandgap reference based voltage generator. Thus, as shown in FIG. 3A and FIG. 3B, voltage $V_{G\_N}$ can be generated based on a supply voltage or a bandgap reference voltage.

Figure 4:
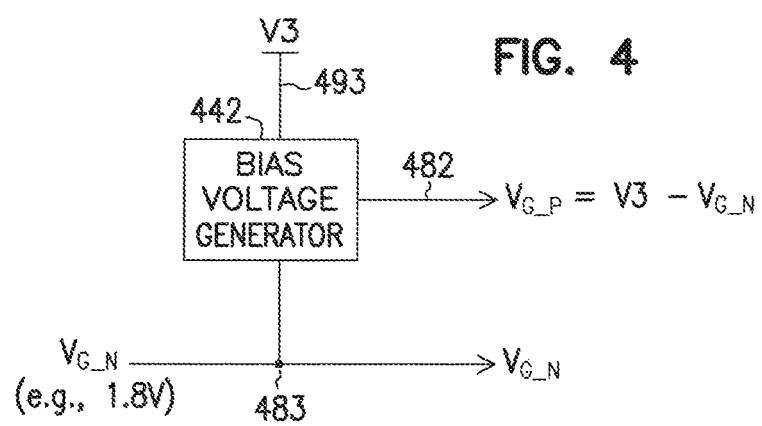
FIG. 4 shows a block diagram of a bias voltage generator to generate another bias voltage, according to some embodiments described herein.

FIG. 4 shows a block diagram of a bias voltage generator 442 to generate a voltage (e.g., bias voltage) $V_{G\_P}$ at a node 482, according to some embodiments described herein. Bias voltage generator 442 can be used as bias voltage generator 142 (FIG. 1) or bias voltage generator 242 of buffer 210 (FIG. 2). Bias voltage generator 442 can generate voltage $V_{G\_P}$ based on voltage V3 (e.g., supply voltage VDD_IO) at node 493 (e.g., supply node) and voltage $V_{G\_N}$ at a node 483. The value of voltage $V_{G\_P}$ can be the difference between the values of voltages V3 and $V_{G\_N}$ (e.g., $V_{G\_P}=V3-V_{G\_N}$).

Node 482 can correspond to node 182 (coupled to the gate of transistor P2) of FIG. 1 or node 282 (coupled to the gate of transistor P2) of FIG. 2. Node 483 (that receives voltage $V_{G\_N}$ in FIG. 4) can correspond to node 183 (coupled to the gate of transistor N2) of FIG. 1 or node 283 (coupled to the gate of transistor N2) of FIG. 2.

Figure 5:
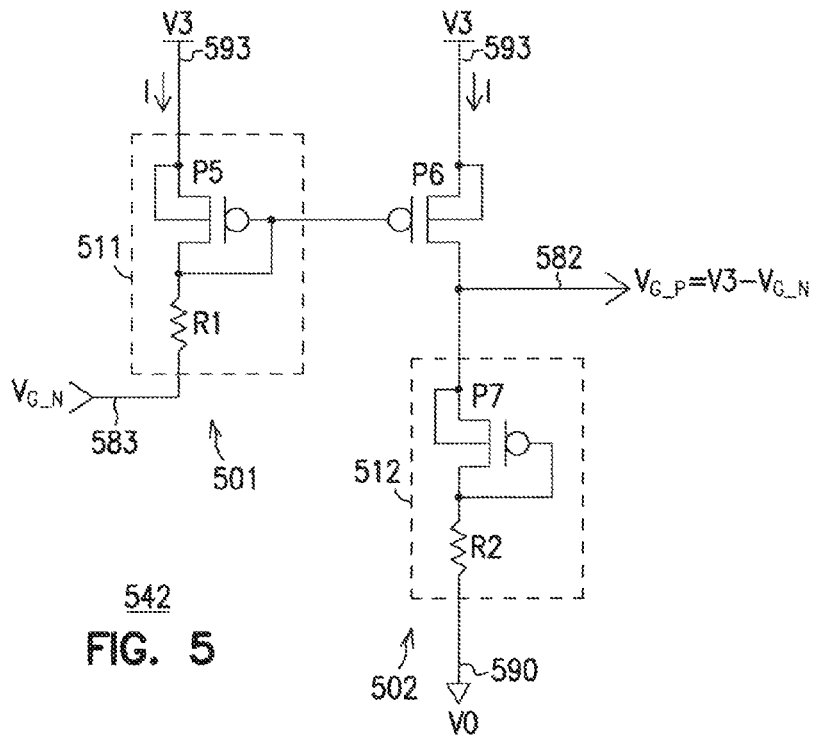
FIG. 5 shows a circuit diagram of a bias voltage generator, according to some embodiments described herein.

FIG. 5 shows a circuit diagram of bias voltage generator 542 to generate a voltage (e.g., bias voltage) $V_{G\_P}$ at a node 582 (output of bias voltage generator 542), according to some embodiments described herein. Bias voltage generator 542 can be used as a bias voltage generator of an I/O circuit (e.g., a buffer), such as bias voltage generator 142 of buffer $110_0$ of FIG. 1 or bias voltage generator 242 of buffer 210 of FIG. 2.

As shown in FIG. 5, bias voltage generator 542 can include a node (e.g., supply node) 593 to receive a voltage V3 and a node 583 to receive a voltage $V_{G\_N}$. Voltage V3 can be a supply voltage (e.g., VDD_IO=3.3V) of a buffer of a device (or system) that includes bias voltage generator 542. Voltage $V_{G\_N}$ can be generated based on another supply voltage of the buffer of a device (or system) that includes bias voltage generator 542. For example, voltage $V_{G\_N}$ can be generated by bias voltage generator 341A of FIG. 3A. Alternatively, voltage $V_{G\_N}$ in FIG. 5 can be generated based on a bandgap reference voltage. For example, voltage $V_{G\_N}$ can be generated by bias voltage generator 341B of FIG. 3B.

Voltage $V_{G\_N}$ in FIG. 5 can be the same as the voltage (bias voltage) provided (e.g., applied) to a gate of a transistor (e.g., transistor N2) of an output stage of the buffer that includes bias voltage generator 542. Voltage $V_{G\_P}$ can be another bias voltage provided (e.g., applied) to a gate of another transistor (e.g., transistor P2) of the buffer.

As shown in FIG. 5, bias voltage generator 542 can include circuit branches 501 and 502. Circuit branch 501 can include a transistor P5 (e.g., p-channel transistor) and a resistor R1 coupled between nodes 583 and 593, such that the value of current I is proportional to the difference between the values of voltage V3 at node 593 and voltage $V_{G\_N}$ at node 583. Circuit branch 502 can include transistors P6 and P7 (e.g., p-channel transistors) and a resistor R2 coupled between node 593 and a node 590. Node 590 can receive a voltage V0 (e.g., ground potential, such as Vss). Circuit branches 501 and 502 can be arranged in a current mirror arrangement to mirror a current I from circuit branch 501 to circuit branch 502.

Circuit branches 501 and 502 can include circuit portions 511 and 512, respectively. Circuit portions 511 and 512 have matched circuit structure, such that the structure of circuit portion 511 matches (e.g., is the same as) the structure of circuit portion 512. For example, transistors P5 and P7 can have the same transistor structure. Resistors R1 and R2 can have the same resistance value. Thus, in operation, the value of the voltage (e.g., voltage drop $V3-V_{G\_N}$) across circuit portion 511 (which is also a function of current I and the resistance of circuit portion 511) can be the same as the value of the voltage (e.g., voltage drop $V_{G\_P}-V0$) across circuit portion 512 (which is a function of current I and a resistance of circuit portion 512). Therefore, $V_{G\_P}-V0=V3-V_{G\_N}$. Since V0 can be zero (e.g., ground potential), $V_{G\_P}=V3-V_{G\_N}$.

In sum, when bias voltage generator 542 of FIG. 5 is used in a buffer (e.g., one of buffers $110_0$ through $110_M$ of FIG. 1 or buffer 210 of FIG. 2), the value of a bias voltage (e.g., $V_{G\_P}$) provided to the gate of a transistor (e.g., P2 in FIG. 1 or FIG. 2) at an output stage of the buffer can be the difference between the value of a supply voltage (e.g., V3) at the output stage of the buffer and the value of another bias voltage (e.g., $V_{G\_N}$) provided to the gate of another transistor (e.g., N2 in FIG. 1 or FIG. 2) of the output stage of the buffer.

Generating voltage $V_{G\_P}$ based on voltage $V_{G\_N}$, as described above with reference to FIG. 5, may allow bias voltage generator 542 to improve operations of an I/O circuit (e.g., each of buffers $110_0$ through $110_M$ of FIG. 1 or buffer 210 of FIG. 2) that includes bias voltage generator 542, in comparison with some conventional I/O circuits. For example, some conventional I/O circuits that use conventional biasing techniques (e.g., resistive voltage division and constant voltage biasing techniques) may have one or more of the following issues: asymmetric transmitter rise and fall times due to unequal $V_{GS}$ (gate overdrive voltage) for PMOS and NMOS drivers, especially over variation in I/O supply voltage (e.g., variation in voltage similar to voltage V3 in FIG. 5); use of large devices due to sub-optimal $V_{GS}$, especially at the lower limit of supply voltage range; and low noise resilience in receivers due to high variation in switching thresholds of transistor (e.g., transistor in the output stage of the I/O circuit).

In FIG. 5, generating voltage $V_{G\_P}$ using bias voltage generator 542 based on voltage $V_{G\_N}$ may allow an I/O circuit (e.g., buffer 210 of FIG. 2) that includes bias voltage generator 542 to reduce or eliminate one or more of the above issues that may occur in some conventional I/O circuits. Moreover, with the arrangement as shown in FIG. 5, the devices (e.g., transistors P5, P6, and P7) of bias voltage generator 542 may be protected (e.g., self-protected) against voltage stress potentially caused by voltage V3.

As mentioned above, bias voltage generator 542 can be used as a bias voltage generator of an I/O circuit, such as a buffer (e.g., buffer $110_0$ of FIG. 1 or buffer 210 of FIG. 2). Bias voltage generator 542, however, may also be used in other I/O circuits, such as receiver circuits and level shifter circuits, and other circuits that may use a bias voltage (e.g., voltage $V_{G\_P}$) control a gate of a transistor among transistors coupled (e.g., coupled in series) between nodes having different voltages (e.g., different supply voltages).

Figure 6:
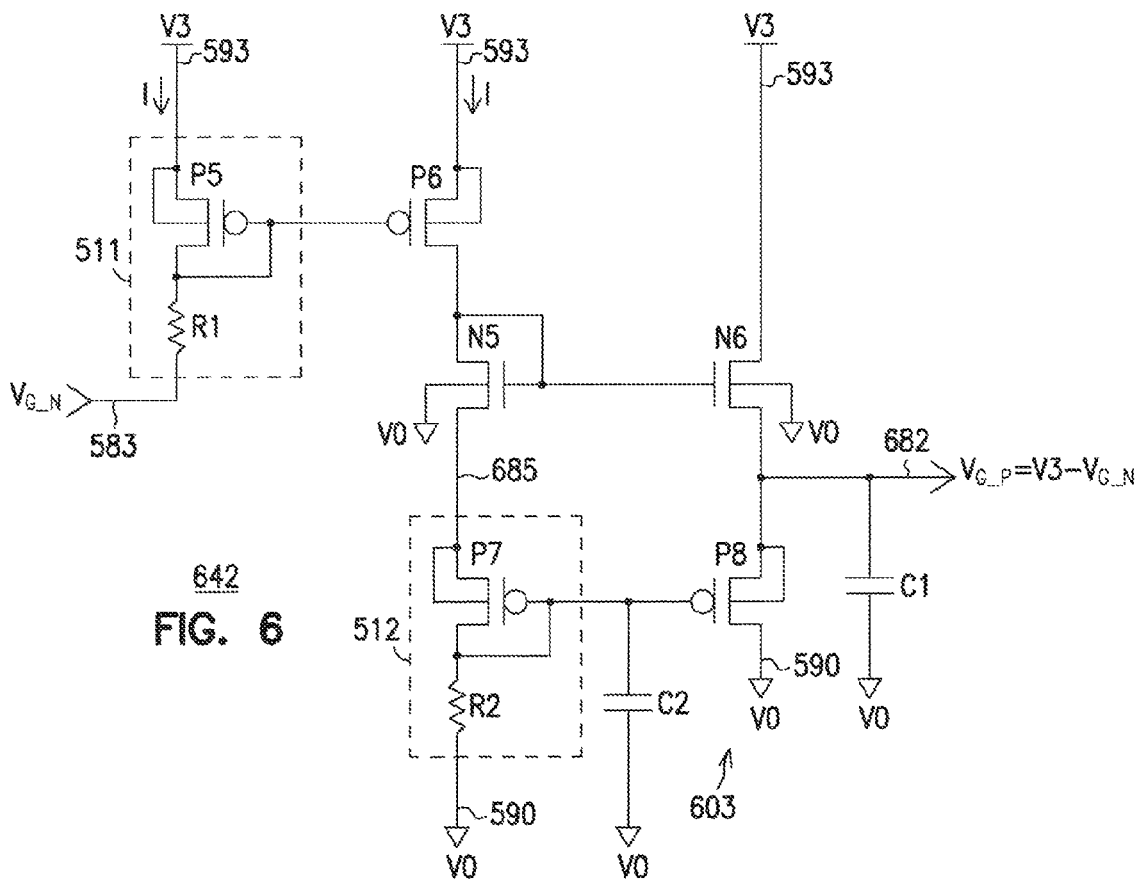
FIG. 6 shows another bias voltage generator that can be a variation of the bias voltage generator of FIG. 5, according to some embodiments described herein.

FIG. 6 shows a bias voltage generator 642 that can be variation of bias voltage generator 542 of FIG. 5, according to some embodiments described herein. Bias voltage generators 542 (FIG. 5) and 642 (FIG. 6) can include similar or identical elements, such as voltages V3 and $V_{G\_N}$ and circuit portions 511 and 512. For simplicity, the description of similar or identical elements between bias voltage generators 542 and 642 is not repeated in the description of bias voltage generator 642. Bias voltage generator 642 can be used as a bias voltage generator of an I/O circuit (e.g., a buffer), such as bias voltage generator 142 of buffer $110_0$ of FIG. 1 or bias voltage generator 242 of buffer 210 of FIG. 2.

As shown in FIG. 6, besides transistor P6 and circuit portions 511 and 512, bias voltage generator 642 can include additional elements such as transistor P8 (e.g., p-channel transistor) and N5 and N6 (e.g., n-channel transistors), and capacitors C1 and C2. Some of these additional elements (e.g., transistors N6 and P8) can be included in a circuit branch 603 between nodes 593 and 590. Bias voltage generator 642 can include an output at node 682 in circuit branch 603.

The value of the voltage at node 685 can be the same as (e.g., substantially equal to) the value of the voltage (e.g., $V3-V_{G\_N}$) across circuit portion 511. The value of voltage $V_{G\_P}$ at node 682 (output of bias voltage generator 642) can be the same as (e.g., substantially equal to) the value of the voltage at node 685. Since the value of the voltage at node 685 can be $V3-V_{G\_N}$ (the difference between the values of voltages V3 and $V_{G\_N}$), the value of voltage ($V_{G\_P}$) at node 682 can also be $V_{G\_P}=V3-V_{G\_N}$.

Although voltage $V_{G\_P}$ in bias voltage generators 542 (FIG. 2) 642 (FIG. 6) can have the same value (e.g., $V_{G\_P}=V3-V_{G\_N}$), the additional elements (e.g., transistors P8, N5, and N6, and capacitors C1 and C2 which can operate to stabilize the buffer) in bias voltage generator 642 may allow it to have a lower output impedance than that of bias voltage generator 542. This may allow bias voltage generator 642 to be suitable for a buffer in which the output stage of such a buffer is arranged to have relatively lower impedance.

For example, node 682 can correspond to node 282 of FIG. 2. Thus, when bias voltage generator 642 is used in buffer 210, pre-driver 231 of buffer 210 may pump a relatively high amount of transient current into bias voltage generator 642. Further, signal $D_{OUT}$ of buffer 210 may switch at a relatively high frequency (e.g., fast swings). This may cause a high amount of capacitive coupling through the gate-drain voltage of transistor P6 when bias voltage generator 642 is used in buffer 210. The additional elements (e.g., transistor P8, N5, and N6, and capacitors C1 and C2, as shown in FIG. 6) in bias voltage generator 642 it may allow it to have a relatively lower output impedance (e.g., impendence at node 682) that may improve the operation of bias voltage generator 642 and buffer 210.

Bias voltage generator 642 may also be used in a buffer in which one of the bias voltages is generated based on a bandgap reference voltage. For example, if voltage $V_{G\_N}$ of buffer 210 of FIG. 2 is generated based on a bandgap reference voltage, using bias voltage generator 642 that has relatively lower output impedance that may improve the operation of bias voltage generator 642 and buffer 210.

Generating voltage $V_{G\_P}$ based on voltage $V_{G\_N}$, as described above with reference to FIG. 6, may allow bias voltage generator 642 to improve operations of an I/O circuit (e.g., each of buffers $110_0$ through $110_M$ of FIG. 1 or buffer 210 of FIG. 2) that includes bias voltage generator 542 in comparison with some conventional I/O circuits. For example, some conventional I/O circuits that use conventional biasing techniques (e.g., resistive voltage division and constant voltage biasing techniques) may have one or more of the following issues: high output impedance variation and variation in I/O supply voltage causing signal integrity and noise issues; unstable bias voltages due to high output impedance of the bias generators; and other issues mentioned above with reference to the description of FIG. 5 (e.g., asymmetric transmitter rise and fall times due to unequal $V_{GS}$ for PMOS and NMOS drivers, especially over variation in I/O supply voltage; use of large devices due to sub-optimal $V_{GS}$, especially at the lower limit of supply voltage range; and low noise resilience in receivers due to high variation in switching thresholds of transistor).

In FIG. 6, generating voltage $V_{G\_P}$ using bias voltage generator 642 based on voltage $V_{G\_N}$ may allow an I/O circuit (e.g., each of buffers $110_0$ through $110_M$ of FIG. 1 or buffer 210 of FIG. 2) that includes bias voltage generator 642 of FIG. 6 to reduce or eliminate one or more of the above issues that may occur in some conventional I/O circuits. Moreover, with the arrangement as shown in FIG. 6, the devices (e.g., transistors P5, P6, P7, P8, N5 and N6) of bias voltage generator 642 may be protected (e.g., self-protected) against voltage stress potentially caused by voltage V3. Bias voltage generator 642 may also be relatively smaller than some conventional I/O circuits.

Further, in comparison with some conventional I/O circuits that use conventional biasing techniques (e.g., resistive voltage division technique), the I/O circuit that uses voltage $V_{G\_P}$ generated by bias voltage generator 642 based on voltage $V_{G\_N}$ may have an approximately 15% improvement (e.g., benefit) in operating frequency of the I/O circuit and a significantly (e.g., approximately 70%) better current sinking and sourcing capability of the biasing circuit. Depending on the interface specification (e.g., specification based on conventional standards) that the buffer may be used, an appropriate trade-off point can be chosen such that these improvements can be used for better performance or die area or power consumption of the interface. The I/O circuit that includes bias voltage generator 642 of FIG. 6 may be relatively smaller than some conventional I/O circuits.

Moreover, generating voltage $V_{G\_P}$ using bias voltage generator 542 (FIG. 5) or 642 (FIG. 6) based on voltage $V_{G\_N}$ (e.g., $V_{G\_P}=V3-V_{G\_N}$), as described above with reference to FIG. 5 and FIG. 6, may provide the maximum allowed and equal (e.g., symmetry bias) overdrive ($V_{GS}$) to both PMOS and NMOS transistors (e.g., P2 and N2 in FIG. 1 or FIG. 2) of the I/O circuit. The supply voltage (e.g., V3) of the I/O circuit may have an operating range (e.g., a specified range) such that the value of the supply voltage (e.g., V3) can have different values, depending on the interface specification (as mentioned above). Generating voltage $V_{G\_P}$ using bias voltage generator 542 (FIG. 5) or 642 (FIG. 6) may also provide equal overdrive to the transistors (e.g., P2 and N2 in FIG. 1 or FIG. 2) across variations (e.g., across different voltages values) in the supply voltage (e.g., V3) of the I/O circuit.

For example, in FIG. 1 (or FIG. 2), if the value of voltage V3 is 2.7V and the value of voltage $V_{G\_N}$ is 1.7V (e.g., the overdrive of transistor N2), then voltage $V_{G\_P}$=V3−$V_{G\_N}$=2.7−1.7=1.0V. Thus, the overdrive of transistor P2 is 2.7V−1.0V=1.7V, which is equal to the overdrive of transistor N2 in this example. In another example, in FIG. 1 (or FIG. 2), if the value of voltage V3 is 3.6V and the value of voltage $V_{G\_N}$ is 1.7V (e.g., the overdrive of transistor N2), then voltage $V_{G\_P}$=V3−$V_{G\_N}$=3.6−1.7=1.9V. Thus, the overdrive of transistor P2 is 2.7V−1.9V=1.7V, which is also equal to the overdrive of transistor N2 in this example. Thus, using bias voltage generator 542 (FIG. 5) or 642 (FIG. 6) to generate voltage $V_{G\_P}$ based on voltage $V_{G\_N}$ and voltage V3, such that $V_{G\_P}$=V3−$V_{G\_N}$, may provide symmetrical overdrive to the transistors (e.g., P2 and N2 in FIG. 1 or FIG. 2) of the buffer. This may allow the buffer to have improvements (e.g., benefits) over some conventional buffers, such as improvements discussed above.

As mentioned above, bias voltage generator 642 can be used as a bias voltage generator of an I/O circuit, such as a buffer (e.g., buffer $110_0$ of FIG. 1 or buffer 210 of FIG. 2). Bias voltage generator 642, however, may also be used in other I/O circuits, such as receiver circuits and level shifter circuits, and other circuits that may use a bias voltage (e.g., voltage $V_{G\_P}$) control a gate of a transistor among transistors coupled (e.g., coupled in series) between nodes having different voltages (e.g., different supply voltages).

Figure 7:
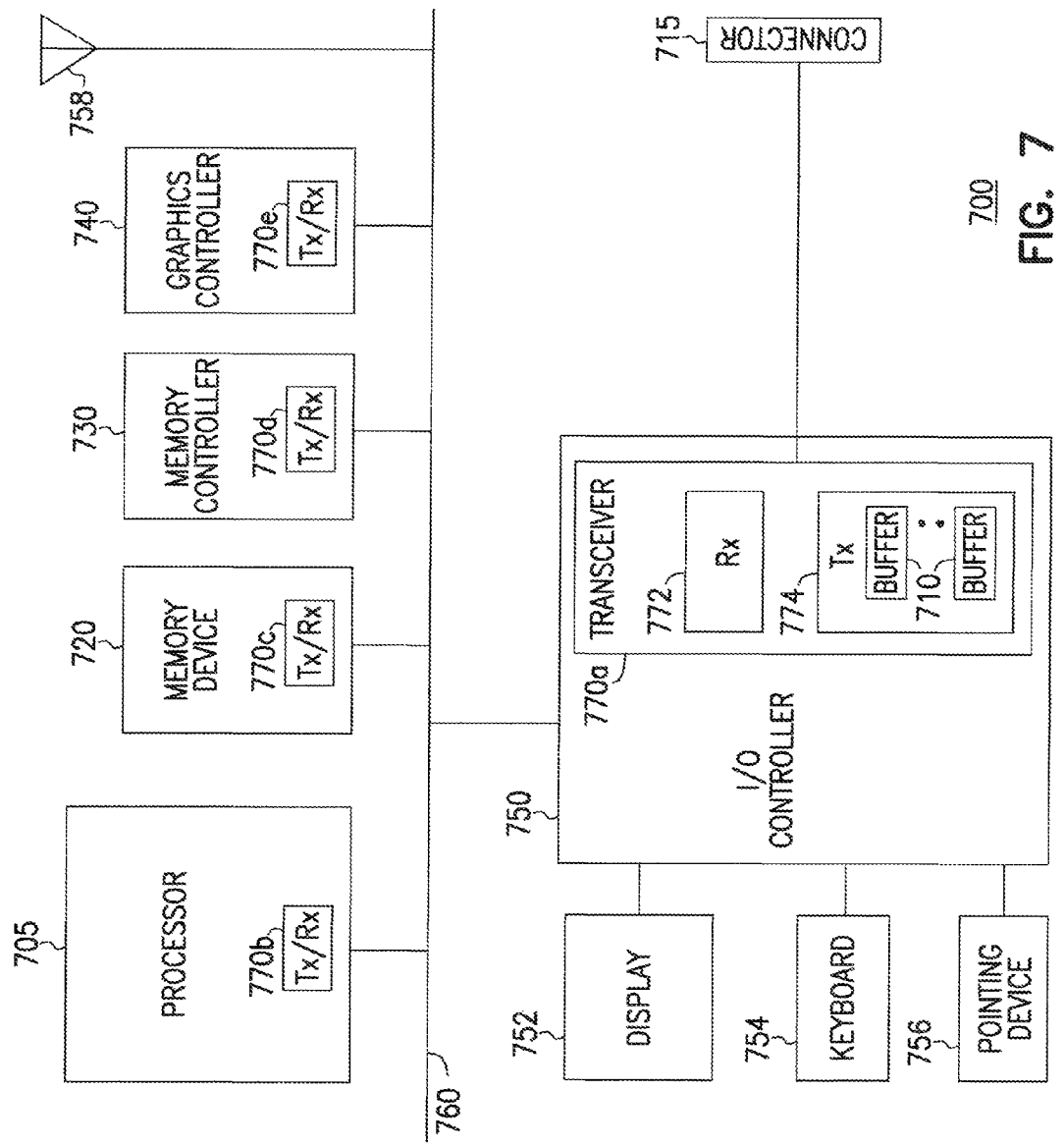
FIG. 7 shows an apparatus in the form of a system, according to some embodiments described herein.

FIG. 7 shows an apparatus in the form of according to some embodiments described herein. System 700 can include or be included in a computer, a cellular phone, or other electronic systems. As shown in FIG. 7, system 700 can include a processor 705, a memory device 720, a memory controller 730, a graphics controller 740, an input and output (I/O) controller 750, a display 752, a keyboard 754, a pointing device 756, at least one antenna 758, a connector 715, and a bus 760.

Each of processor 705, memory device 720, memory controller 730, graphics controller 740, and I/O controller 750 can include an IC such as IC 101 (FIG. 1).

In some arrangements, system 700 does not have to include a display. Thus, display 752 can be omitted from system 700. In some arrangements, system 700 does not have to include any antenna. Thus, antenna 758 can be omitted from system 700.

Processor 705 may include a general-purpose processor or an application specific integrated circuit (ASIC).

Memory device 720 may include a dynamic random access memory (DRAM) device, a static random access memory (SRAM) device, a flash memory device, or a combination of these memory devices. FIG. 7 shows an example where memory device 720 is a stand-alone memory device separated from processor 705. In an alternative arrangement, memory device 720 and processor 705 can be located on the same die. In such an alternative arrangement, memory device 720 is an embedded memory in processor 705, such as embedded DRAM (eDRAM), embedded SRAM (eSRAM), embedded flash memory, or another type of embedded memory.

Display 752 can include a liquid crystal display (LCD), a touchscreen (e.g., capacitive or resistive touchscreen), or another type of display. Pointing device 756 can include a mouse, a stylus, or another type of pointing device.

I/O controller 750 can include a communication module for wired or wireless communication (e.g., communication through one or more antenna 758). Such wireless communication may include communication in accordance with WiFi communication technique, Long Term Evolution Advanced (LTE-A) communication technique, or other communication techniques.

I/O controller 750 can also include a module to allow system 700 to communicate with other devices or systems in accordance with to one or more of the following standards (e.g., I/O standards), including the Secure Digital standard (e.g., Secure Digital Input Output (SDIO) standard), the MultiMediaCard (MMC) standard, the Universal Serial Bus (USB) standard, and the Subscriber Identity Module (SIM) standard (e.g., universal SIM (USIM) standard).

Connector 715 can be arranged (e.g., can include terminals, such as pins) to allow system 700 to be coupled to an external device (or system). This may allow system 700 to communicate (e.g., exchange information) with such device (or system) through connector 715. Connector 715 can be at least one of (e.g., one or more of) a SDIO connector, an MMC connector, USB connector, SIM (or USIM) connector, and other types of connectors.

I/O controller 750 can include a transceiver (Tx/Rx) 770a having a receiver (Rx) 772 and a transmitter (Tx) 774. Receiver 772 can operate to allow I/O controller 750 to receive information from another part of system 700 or from an external device (or system) coupled to connector 715. Transmitter 774 can include buffers 710 to allow I/O controller 750 to transmit information from I/O controller 750 to another part of system 700 or to an external device (or system) coupled to connector 715.

Each of the buffers 710 can include any of the buffers (e.g., buffers $110_0$ through $110_M$ and buffer 210) including bias voltage generators (e.g., 141, 142, 241, 242, 341A, 341B, 442, 542, and 642) described above with reference to FIG. 1 through FIG. 6. Thus, buffers 710 can be arranged to operate in ways similar to, or identical to, those of any of the buffers described above with reference to FIG. 2 through FIG. 6. In FIG. 7, for example, each of buffers 710 can include an output node (e.g., 120 or 121 of FIG. 1 or 220 of FIG. 2) arranged to couple to connector 715 to allow I/O controller 750 to communicate with an external device (or system) coupled to connector 715.

As shown in FIG. 7, processor 705, memory device 720, memory controller 730, and graphics controller 740 can include transceivers 770b, 770c, 770d, and 770e, respectively, to allow each of these components to transmit and receive information through their respective transceiver. At least one of transceivers 770b, 770c, 770d, and 770e can be similar to or identical to transceiver 770a. Thus, at least one of transceivers 770b, 770c, 770d, and 770e can include one or more buffers that can be similar to or identical to buffers 710. For example, at least one of transceivers 770a, 770b, 770c, 770d, and 770e can include at least one of buffers 710 having an output node (e.g., 120 or 121 of FIG. 1 or 220 of FIG. 2) that can be arranged to couple to connector 715 to allow at least one of processor 705, memory device 720, memory controller 730, and graphics controller 740 to communicate with an external device (or system) coupled to connector 715.

FIG. 7 shows the components of system 700 arranged separately from each other as an example. For example, each of processor 705, memory device 720, memory controller 730, graphics controller 740, and I/O controller 750 can be located on a separate die (e.g., semiconductor die or an IC chip). In some arrangements, two or more components (e.g., processor 705, memory device 720, graphics controller 740, and I/O controller 750) of system 700 can be located on the same die (e.g., same IC chip) that forms a system-on-chip (SoC). In such arrangements, the output node of the buffer, such as one of buffers 710, in at least one of processor 705, memory device 720, memory controller 730, graphics controller 740, and I/O controller 750, can be part of an input/out (I/O) pad of the SoC.

Figure 8:
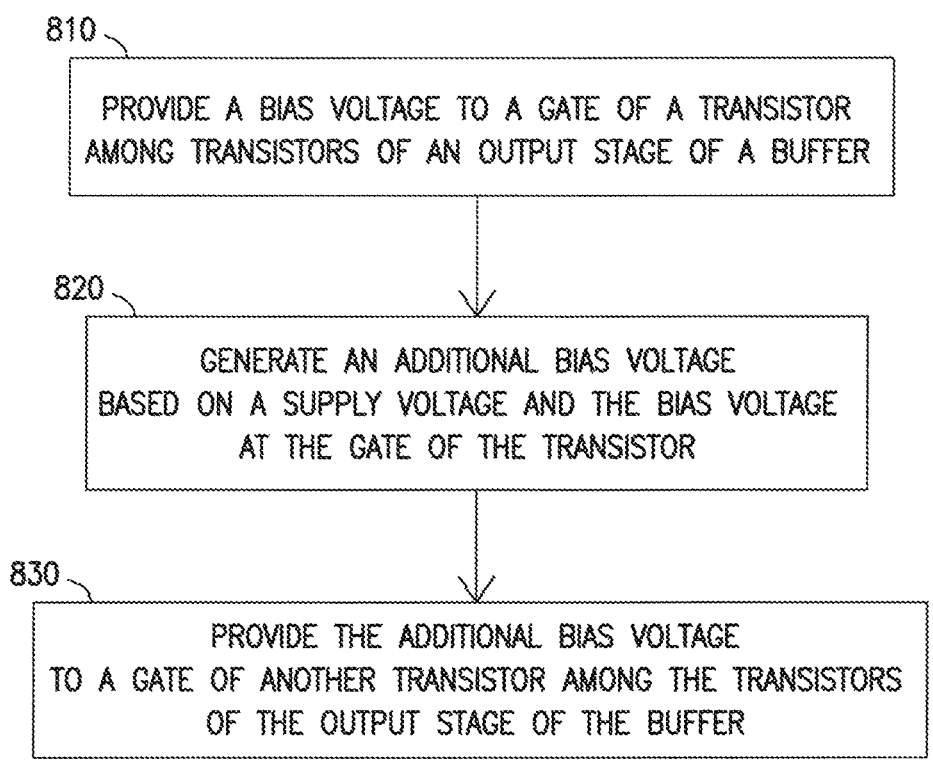
FIG. 8 is a flowchart showing a method of operating a buffer, according to some embodiments described herein.

FIG. 8 is a flowchart showing a method 800 of operating a buffer, according to some embodiments described herein. The buffer used in method 800 can include any of the buffers (e.g., buffers 110$_0$ through 110$_M$ of FIG. 1, buffer 210 of FIG. 2, and buffers included in at least one of transceivers 770*a* through 770*e* of FIG. 7) described above with reference to FIG. 1 through FIG. 7.

As shown in FIG. 8, activity 810 of method 800 can include providing a bias voltage to a gate of a transistor among transistors of an output stage of a buffer. The transistor can be coupled between a supply voltage and ground. Activity 820 can include generating an additional bias voltage based on the supply voltage and the bias voltage generated in activity 810. Activity 830 can include providing the additional bias voltage to a gate of another transistor among the transistors of the output stage of the buffer.

Method 800 can include fewer or more activities relative to activities 810, 820, and 830 shown in FIG. 8. For example, method 800 can include activities and operations of a buffer described above with reference to FIG. 1 through FIG. 7.

The illustrations of the apparatuses (e.g., apparatus 100 including IC 101 and system 700) and methods (e.g., method 800 and operations of IC 101, buffers 110$_0$ through 110$_M$, buffer 210, buffers 710, and system 700) described above are intended to provide a general understanding of the structure of different embodiments and are not intended to provide a complete description of all the elements and features of an apparatus that might make use of the structures described herein.

The apparatuses and methods described above can include or be included in high-speed computers, communication and signal processing circuitry, single or multi-processor modules, single or multiple embedded processors, multi-core processors, message information switches, and application-specific modules including multilayer, multi-chip modules. Such apparatuses may further be included as sub-components within a variety of other apparatuses (e.g., electronic systems), such as televisions, cellular telephones, personal computers (e.g., laptop computers, desktop computers, handheld computers, etc.), tablets (e.g., tablet computers), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

ADDITIONAL NOTES AND EXAMPLES

Example 1 includes subject matter (such as a device, circuit apparatus or electronic system apparatus, or machine) including a first node to receive a supply voltage, a second node to receive a first bias voltage provided to a gate of a first transistor of a plurality of transistors coupled in series, a third node to receive ground potential, a first circuit branch coupled between the first and second nodes, and a second circuit branch coupled between the first and third nodes, wherein the first and second circuit branches are arranged to provide a second bias voltage to a gate of a second transistor of the plurality of transistors, such that a value of the second bias voltage is based on a value of the first bias voltage.

In Example 2, the subject matter of Example 1 may optionally include, wherein the value of the second bias voltage is based on a difference between a value of the supply voltage and the value of the first bias voltage.

In Example 3, the subject matter of Example 1 may optionally include, wherein the first circuit branch including a first circuit portion coupled between the first and second nodes, the second circuit branch including a second circuit portion coupled between the first and third nodes, and the first and second circuit portions have matched circuit structure.

In Example 4, the subject matter of Example 1 may optionally include a third circuit branch coupled between the first and third nodes and coupled to the first and second circuit branches, wherein third circuit branch includes a node to provide the second bias voltage.

In Example 5, the subject matter of Example 1 may optionally include, wherein the first transistor is included in a pair of transistors of the plurality of transistors, the pair of transistors is coupled between the third node and an output node of an input/output (I/O) circuit, the second transistor is included in an additional pair of transistors of the plurality of transistors, and the additional pair of transistors is coupled between the output node of the I/O circuit and the first node.

Example 6 includes subject matter (such as a device, circuit apparatus or electronic system apparatus, or machine) including a first node to receive a first voltage, a second node to receive a second voltage less than the first voltage, an output stage including transistors coupled between the first and second nodes, and a bias stage to provide a first bias voltage to a gate of a first transistor among the transistors and to provide a second bias voltage to a gate of a second transistor among the transistors, and a value of second bias voltage is based on a value of the first voltage and a value of the first bias voltage.

In Example 7, the subject matter of any one of Example 6 may optionally include, wherein the first voltage includes a first supply voltage, the second voltage includes ground potential, and the first bias voltage includes a second supply voltage of the apparatus.

In Example 8, the subject matter of any one of Example 6 may optionally include, wherein the first voltage includes a first supply voltage of the apparatus, the second voltage includes ground potential, and the first bias voltage is generated from a bandgap reference voltage.

In Example 9, the subject matter of Example 6 may optionally include a pre-driver to provide a signal to a gate of a third transistor among the transistors, wherein the pre-driver is arranged such that the signal provided to the gate of the third transistor has a signal swing between a level based on a value of the first voltage and a level based on the value of the second bias voltage.

In Example 10, the subject matter of Example 9 may optionally include an additional pre-driver to provide a signal to a gate of a fourth transistor among the transistors, wherein the additional pre-driver is arranged such that the signal provided to the gate of the fourth transistor has a signal swing between a level based on a value of the second voltage and a level based on the value of the first bias voltage.

In Example 11, the subject matter of Example 6 may optionally include an output node to provide an output signal based on a first input signal and a second input signal, wherein the transistors includes a pair of transistors coupled between the first node and the output node, the pair of transistors including the second transistor and a transistor having a gate to receive the first signal, and an additional pair of transistors coupled between the output node and the second node, the pair of transistors including the first transistor and a transistor having a gate to receive the second signal.

In Example 12, the subject matter of Example 11 may optionally include a third node to receive the first bias voltage, wherein the bias stage includes a bias voltage generator to generate the second bias voltage at an output of the bias voltage generator, the bias voltage generator including a first circuit branch having a first circuit portion coupled between the first and third nodes, and a second circuit branch having a second circuit portion coupled between the first and second nodes, and wherein the first and second circuit portions have matched circuit structure, and the value of the second bias voltage is a function of a current and a resistance across the second circuit portion.

In Example 13, the subject matter of Example 12 may optionally include, wherein the bias voltage generator further comprising a third circuit branch coupled between the first and second nodes and arranged with the first and second circuit branches such that the second bias voltage is provided at a node in the third circuit branch.

In Example 14, the subject matter of Example 13 may optionally include, wherein first additional transistors coupled between the first node and the output of the bias voltage generator, the first additional transistors arranged to operate as an inverter having an input to receive a first input signal and an output to provide the first signal based on the first input signal, and second additional transistors coupled between the second node and the gate of the first transistor of the output stage, the second additional transistors arranged to operate as an inverter having an input to receive a second input signal and an output to provide the second signal based on the second input signal.

In Example 15, the subject matter of Example 6 may optionally include, wherein the first node is arranged to receive the first voltage including a supply voltage having a range from approximately 2.7 volts to approximately 3.6 volts.

In Example 16, the subject matter of Example 15 may optionally include, wherein a third node to receive an additional supply voltage having a value of approximately 1.8 volts, wherein the first bias voltage has a value based on the value of the additional supply voltage.

Example 17 includes subject matter (such as a device, circuit apparatus or electronic system apparatus, or machine) including an integrated circuit including a first node to receive a supply voltage and a second node to receive ground potential, and a transmitter located in the integrated circuit, the transmitter including a buffer to transmit a signal, the buffer including an output stage including a first pair of transistors coupled between the first node and an output node, and a second pair of transistors coupled between the output node and the second node, and a bias stage to provide a first bias voltage to a gate of a transistor in the second pair of transistors and a second bias voltage to a gate of a transistor in the first pair of transistors, wherein a value of each of the first and second bias voltages is greater than zero, and the value of the second bias voltage is based on a value of the supply voltage and the value of the first bias voltage.

In Example 18, the subject matter of Example 17 may optionally include, wherein the value of the second bias voltage is based on a difference between the value of the supply voltage and the value of the first bias voltage.

In Example 19, the subject matter of Example 17 may optionally include, wherein the output node is arranged to couple to a connector, the connector including at least one of a Secure Digital Input Output (SDIO) connector, a Multi-MediaCard (MMC) connector, a Universal Serial Bus (USB) connector, and a Subscriber Identity Module (SIM) connector.

In Example 20, the subject matter of Example 17 may optionally include at least one of a display coupled to the integrated circuit and an antenna coupled to the integrated circuit.

In Example 21, the subject matter of Example 17 may optionally include, wherein the apparatus comprises a system on a chip (SoC), and the output node is part of an input/output (I/O) pad of the SoC.

Example 22 includes subject matter including a method of operating a buffer, the method comprising providing a first bias voltage to a gate of a first transistor among transistors of an output stage of a buffer, the transistors coupled between a node having a supply voltage and ground, generating a second bias voltage based on the supply voltage and the first bias voltage, and providing the second bias voltage to a gate of a second transistor among the transistors.

In Example 23, the subject matter of Example 22 may optionally include providing the first bias voltage includes coupling the gate of the first transistor to an additional supply voltage, the additional supply voltage having a value greater than zero and less than a value of the supply voltage coupled to the transistors.

In Example 24, the subject matter of Example 22 may optionally include, wherein providing the first bias voltage includes coupling the gate of the first transistor to a bandgap reference based voltage generator.

In Example 25, the subject matter of Example 22 may optionally include, wherein generating the second bias voltage includes mirroring a current from a circuit portion of a first circuit branch of a bias voltage generator to a circuit portion of a second circuit branch of the bias voltage generator, the first circuit branch coupled between the node having the supply voltage and the gate of the first transistor, and the circuit portions of the first and second circuit branches having a matched circuit structure, and wherein the second bias voltage is based on a value of a voltage across the matched circuit structure.

The subject matter of Example 1 through Example 25 may be combined in any combination.

The above description and the drawings illustrate some embodiments to enable those skilled in the art to practice the embodiments of the invention. Other embodiments may incorporate structural, logical, electrical, process, and other changes. Examples merely typify possible variations. Portions and features of some embodiments may be included in, or substituted for, those of other embodiments. Many other embodiments will be apparent to those of skill in the art upon reading and understanding the above description. Therefore, the scope of various embodiments is determined by the appended claims, along with the full range of equivalents to which such claims are entitled.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:
1. An apparatus comprising:
a first node to receive a first voltage;
a second node to receive a second voltage less than the first voltage;

an output stage including transistors coupled between the first and second nodes;

a bias stage to provide a first bias voltage to a gate of a first transistor among the transistors and to provide a second bias voltage to a gate of a second transistor among the transistors, and a value of second bias voltage is based on a value of the first voltage and a value of the first bias voltage;

a pre-driver to provide a signal to a gate of a third transistor among the transistors, wherein the pre-driver is arranged such that the signal provided to the gate of the third transistor has a signal swing between a level based on a value of the first voltage and a level based on the value of the second bias voltage; and an additional pre-driver to provide a signal to a gate of a fourth transistor among the transistors, wherein the additional pre-driver is arranged such that the signal provided to the gate of the fourth transistor has a signal swing between a level based on a value of the second voltage and a level based on the value of the first bias voltage.

2. The apparatus of claim 1, wherein the first voltage includes a first supply voltage, the second voltage includes ground potential, and the first bias voltage includes a second supply voltage of the apparatus.

3. The apparatus of claim 1, wherein the first voltage includes a first supply voltage of the apparatus, the second voltage includes ground potential, and the first bias voltage is generated from a bandgap reference voltage.

4. The apparatus of claim 1, further comprising a third node to receive the first bias voltage, wherein the bias stage includes a bias voltage generator to generate the second bias voltage at an output of the bias voltage generator, the bias voltage generator including a first circuit branch having a first circuit portion coupled between the first and third nodes, and a second circuit branch having a second circuit portion coupled between the first and second nodes, and wherein the first and second circuit portions have matched circuit structure, and the value of the second bias voltage is a function of a current and a resistance across the second circuit portion.

5. The apparatus of claim 4, wherein the bias voltage generator further comprising a third circuit branch coupled between the first and second nodes and arranged with the first and second circuit branches such that the second bias voltage is provided at a node in the third circuit branch.

6. An apparatus comprising:
a first node to receive a first voltage;
a second node to receive a second voltage less than the first voltage;
an output stage including transistors coupled between the first and second nodes;
a bias stage to provide a first bias voltage to a gate of a first transistor among the transistors and to provide a second bias voltage to a gate of a second transistor among the transistors, and a value of second bias voltage is based on a value of the first voltage and a value of the first bias voltage;
an output node to provide an output signal based on a first input signal and a second input signal, wherein the transistors includes a pair of transistors coupled between the first node and the output node, the pair of transistors including the second transistor and a transistor having a gate to receive the first signal, and an additional pair of transistors coupled between the output node and the second node, the pair of transistors including the first transistor and a transistor having a gate to receive the second signal;
a third node to receive the first bias voltage, wherein the bias stage includes a bias voltage generator to generate the second bias voltage at an output of the bias voltage generator, the bias voltage generator including a first circuit branch having a first circuit portion coupled between the first and third nodes, and a second circuit branch having a second circuit portion coupled between the first and second nodes, and wherein the first and second circuit portions have matched circuit structure; and the value of the second bias voltage is a function of a current and a resistance across the second circuit portion, wherein the bias voltage generator further comprising a third circuit branch coupled between the first and second nodes and arranged with the first and second circuit branches such that the second bias voltage is provided at a node in the third circuit branch; and first additional transistors coupled between the first node and the output of the bias voltage generator, the first additional transistors arranged to operate as an inverter having an input to receive a first input signal and an output to provide the first signal based on the first input signal; and
second additional transistors coupled between the second node and the gate of the first transistor of the output stage, the second additional transistors arranged to operate as an inverter having an input to receive a second input signal and an output to provide the second signal based on the second input signal.

7. The apparatus of claim 6, wherein the first node is arranged to receive the first voltage including a supply voltage having a range from approximately 2.7 volts to approximately 3.6 volts.

8. The apparatus of claim 7, further comprising a third node to receive an additional supply voltage having a value of approximately 1.8 volts, wherein the first bias voltage has a value based on the value of the additional supply voltage.

9. The apparatus of claim 6, wherein the output node is arranged to couple to a connector, the connector including at least one of a Secure Digital Input Output (SDIO) connector, a MultiMediaCard (MMC) connector, a Universal Serial Bus (USB) connector, and a Subscriber Identity Module (SIM) connector.

10. The apparatus of claim 6, wherein the apparatus comprises a system on a chip (SoC), and the output node is part of an input/output (I/O) pad of the SoC.

11. A method comprising:
providing a first bias voltage to agate of a first transistor among transistors of an output stage of a buffer, the transistors coupled between a node having a supply voltage and ground,
generating a second bias voltage based on the supply voltage and the first bias voltage;
providing the second bias voltage to a gate of a second transistor among the transistors; and
providing a signal to a gate of a third transistor among the transistors, wherein the signal is provided by a pre-driver coupled to the gate of the third transistor, and the pre-driver includes a transistor having a gate coupled to an input node to receive a data input signal, wherein generating the second bias voltage includes mirroring a current from a circuit portion of a first circuit branch of a bias voltage generator to a circuit portion of a second circuit branch of the bias voltage generator, the first circuit branch coupled between the node having the supply voltage and the gate of the first transistor, and the circuit portions of the first and second circuit branches having a matched circuit structure, and wherein the second bias voltage is based on a value of a voltage across the matched circuit structure.

12. The method of claim 11, wherein providing the first bias voltage includes coupling the gate of the first transistor to an additional supply voltage, the additional supply voltage having a value greater than zero and less than a value of the supply voltage coupled to the transistors.

13. The method of claim 11 wherein providing the first bias voltage includes coupling the gate of the first transistor to a bandgap reference based voltage generator.

* * * * *